United States Patent
Sharma et al.

(10) Patent No.: US 6,385,083 B1
(45) Date of Patent: May 7, 2002

(54) MRAM DEVICE INCLUDING OFFSET CONDUCTORS

(75) Inventors: Manish Sharma, Sunnyvale; Manoj Bhattacharyya, Cupertino, both of CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/920,225

(22) Filed: Aug. 1, 2001

(51) Int. Cl.[7] .............................................. G11C 11/14
(52) U.S. Cl. ........................ 365/171; 365/173; 365/63
(58) Field of Search ........................... 365/171, 63, 173

(56) References Cited

U.S. PATENT DOCUMENTS 6,104,632 A * 8/2000 Nishimura ................... 365/158

* cited by examiner

Primary Examiner—Vu A. Le

(57) ABSTRACT

A Magnetic Random Access Memory (MRAM) device includes an array of cells; and a plurality of first conductors on a first side of the array. The first conductors extend in a first direction and are offset from at least some of the memory cells.

23 Claims, 4 Drawing Sheets

MRAM DEVICE INCLUDING OFFSET CONDUCTORS

BACKGROUND

The present invention relates to data storage. More specifically, the present invention relates to magnetic random access memory (MRAM).

MRAM is a non-volatile memory that is being considered for short-term and long-term data storage. MRAM has lower power consumption than short-term memory such as DRAM, SRAM and Flash memory. MRAM can perform read and write operations much faster (by orders of magnitude) than conventional long-term storage devices such as hard drives. In addition, MRAM is more compact and consumes less power than hard drives. MRAM is also being considered for embedded applications such as extremely fast processors and network appliances.

A typical MRAM device includes an array of memory cells, word lines extending along rows of the memory cells, and bit lines extending along columns of the memory cells. Each memory cell is located at a cross point of a word line and a bit line.

The memory cells may be based on magneto-resistive devices such as tunneling magneto-resistive (TMR) devices or giant magneto-resistive (GMR) devices. A typical TMR device includes a pinned layer, a sense layer and an insulating tunnel barrier sandwiched between the pinned and sense layers. The pinned layer has a magnetization orientation that is fixed so as not to rotate in the presence of an applied magnetic field in a range of interest. The sense layer has a magnetization that can be oriented in either of two directions: the same direction as the pinned layer magnetization or the opposite direction of the pinned layer magnetization. If the magnetizations of the pinned and sense layers are in the same direction, the orientation of the TMR device is said to be "parallel." If the magnetizations of the pinned and sense layers are in opposite directions, the orientation of the TMR device is said to be "anti-parallel." These two stable orientations, parallel and anti-parallel, may correspond to logic values of '0' and '1.'

A GMR device has the same basic configuration as a TMR device, except that the data and reference layers are separated by a conductive non-magnetic metallic layer instead of an insulating tunnel barrier. The relative magnetization orientations of the sense and pinned layers affect in-plane resistance of a GMR device operated in a current-in-plane (CIP) geometry, and similarly affect the perpendicular-to-plane resistance of a GMR device operated in a current-perpendicular-to-plane (CPP) geometry.

Density of the memory cells is limited by the in-plane distance between lines. The maximum current that can be driven through the lines is limited by the current density of the lines. These two parameters—line separation and current density—limit the maximum switching fields that can be applied to the sense layers of the magneto-resistive devices.

It would be desirable to increase the maximum switching field that can be applied to the magneto-resistive devices, without reducing memory density. Increasing the maximum magnetic field would allow the coercivity of the memory cells to be increased. Increasing the coercivity, in turn, would increase the integrity of writing data to the memory cells, and it would reduce the undesired side effect of unselected bit erasure. Otherwise, correcting such erasures can increase the burden on error code correction.

SUMMARY

According to one aspect of the present invention, a data storage device includes an array of magnetic memory cells; and a plurality of first conductors on one side of the memory cell array. The first conductors extend in a first direction. The first conductors are offset in a second direction from at least some of the memory cells. The first and second directions are orthogonal.

Other aspects and advantages of the present invention will become apparent from the following detailed description, taken in conjunction with the accompanying drawings, illustrating by way of example the principles of the present invention.

DETAILED DESCRIPTION

Figure 1:
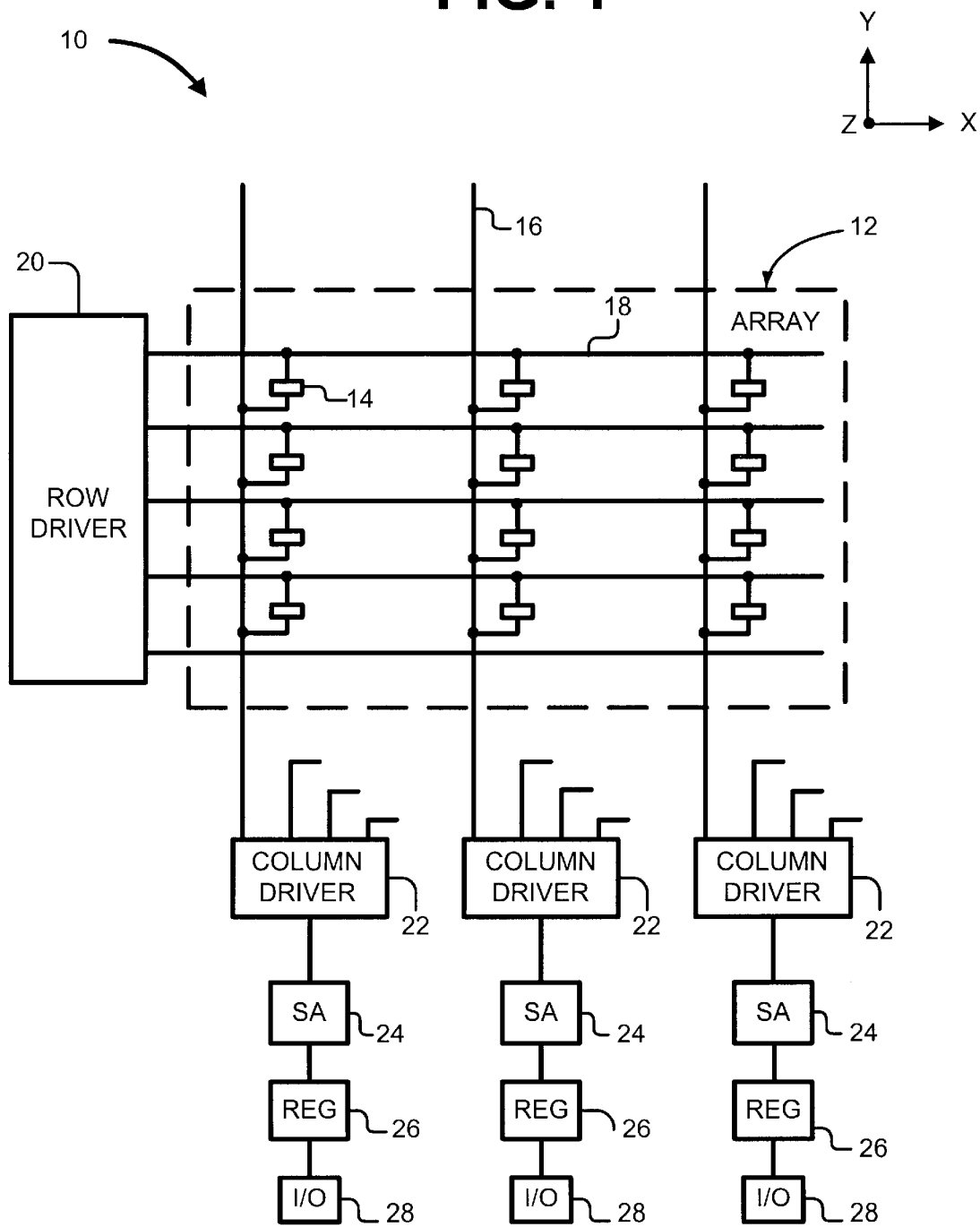
FIGS. 1 and 2 are illustrations of a first MRAM device according to the present invention.
Figure 2:
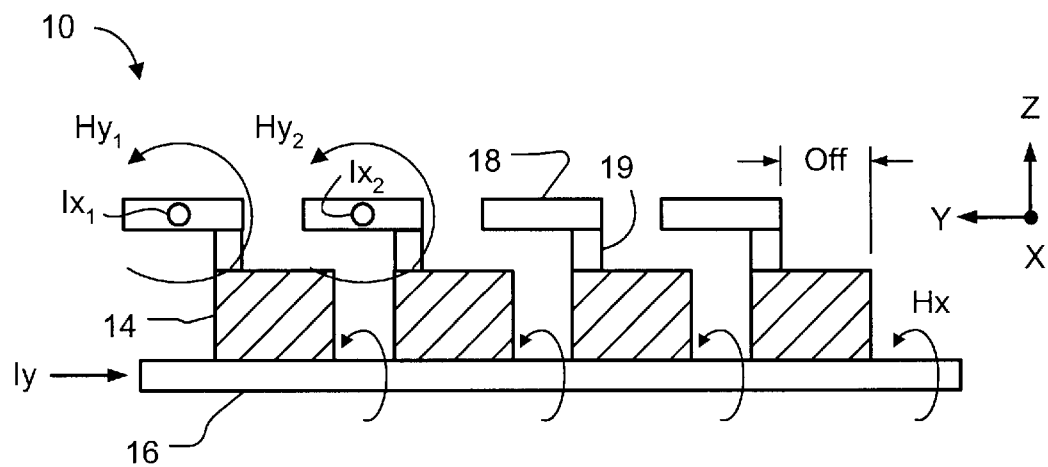

Reference is made to FIGS. 1 and 2, which illustrate an MRAM device 10 including a resistive cross point array 12 of magnetic memory cells 14. The magnetic memory cells 14 may include magneto-resistive devices such as tunneling magneto-resistive devices or giant magneto-resistive devices. The memory cells 14 are arranged in rows and columns, with the rows extending along an x-direction and the columns extending along a y-direction. Only a relatively small number of the memory cells 14 are shown to simplify the illustration of the MRAM device 10. In practice, arrays of any size may be used.

Traces functioning as bit lines 16 extend along the y-direction on a side of the array 12. There may be one bit line 16 for each column of the array 12.

Traces functioning as word lines 18 extend along the x-direction in a plane on an opposite side of the array 12. In a conventional MRAM device (not shown), each memory cell would be located at a cross point of a word line and a bit line. In the MRAM device 10 of FIG. 1, in contrast, the word lines 18 are offset in the y-direction from the memory cells 14. This offset is referenced by the letters Off. Each memory cell 14 is located between, and overlapped by, two adjacent word lines 18. Each memory cell 14 is also electrically connected to a bit line 16 and one of the adjacent word lines 18. The electrical connections between the memory cells 14 and the word lines 18 are made by vias 19.

The MRAM device 10 includes a row driver 20 and column drivers 22 for supplying write currents ly, $lx_1$ and $lx_2$ to selected bit and word lines 16 and 18 during write operations. These write currents ly, $lx_1$ and $lx_2$ give rise to magnetic fields Hx, $Hy_1$ and $Hy_2$ about the selected bit and word lines 16 and 18. Because a selected memory cell 14 lies between two selected adjacent word lines 18 and it lies over a selected bit line 16, it "sees" magnetic fields Hx, $Hy_1$ and $Hy_2$ from three lines. These magnetic fields Hx, $Hy_1$ and $Hy_2$, when combined, are strong enough to change the magnetization orientation of the selected memory cell 14.

Half-selected cells (that is, memory cells 14 along either a selected bit line 16 or only one selected word line) will see only one of the three magnetic fields Hx, $Hy_1$ and $Hy_2$; therefore, the magnetization orientations of the half-selected cells should not be affected. Similarly, memory cells 14 that are along both a selected bit line 16 and a single selected word line 18 will see only two of the three magnetic fields $H_x$, $Hy_1$ and $Hy_2$; therefore, their magnetization orientations should not be affected. For a desired magnetic field, the two adjacent word lines 18 may share the write current. Both adjacent lines 18 may be driven at less than maximum rated current capacity during write operations. Moreover, unequal write currents may be supplied to the lines 16 and 18.

Because the word lines 18 are offset, they are further away from the memory cells 14 than are the word lines in a conventional MRAM device. However, two adjacent word lines 18 that are offset from a memory cell 14 have been found to provide a stronger magnetic field than a single word line that is not offset from a memory cell.

The MRAM device 10 further includes sense amplifiers 24 connected to the column drivers 22. Outputs of the sense amplifiers 24 are coupled to data registers 26, and outputs of the data registers 26 are coupled to I/O pads 28 of the MRAM device 10. The sense amplifiers 24 sense the resistance states of selected memory cells 14 during read operations. A simple sensing method may be performed by applying a voltage across a selected memory cell 14, and sensing the current flowing though the selected memory cell 14.

The memory cells 14 are coupled together through many parallel paths. The resistance seen at one connection equals the resistance of the memory cell 14 at that connection in parallel with resistances of memory cells 14 in the other rows and columns. Thus the array 12 of memory cells 14 may be characterized as a cross point resistor network.

Because the memory cells 14 are connected as a cross point resistor network, parasitic or sneak path currents can interfere with the read operations on selected memory cells 14. Blocking devices such as diodes or transistors may be connected to the memory cells 14. These blocking devices can block the parasitic currents.

In the alternative, the parasitic currents may be dealt with by using an "equipotential" method disclosed in assignee's U.S. Pat. No. 6,259,644. As an example of the equipotential method, the column drivers 22 may provide the same potential to the unselected bit lines 16 as the selected bit line 16, or the row driver 20 may provide the same potential to the unselected word lines 16 as the selected bit line 16.

Figure 3:
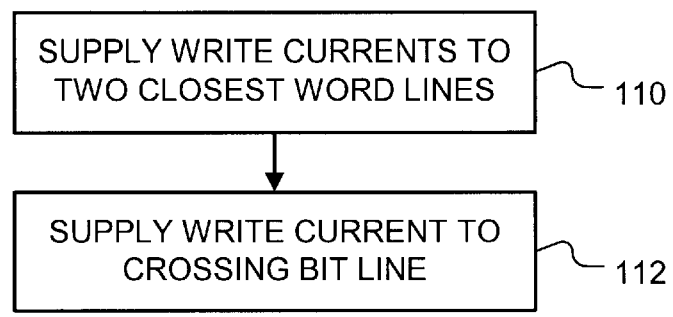
FIG. 3 is an illustration of a method of writing to the first MRAM device.

Reference is now made to FIG. 3, which shows a method of writing to a selected memory cell. Write currents are supplied to the two word lines that are closest to the selected memory cell (block 110), and a write current is supplied to the bit line crossing the memory cell (block 112). The combined magnetic fields from these three lines causes magnetization of the selected memory cell to assume a desired orientation. Direction of the magnetization orientation will depend upon the directions of the write currents.

Figure 5:
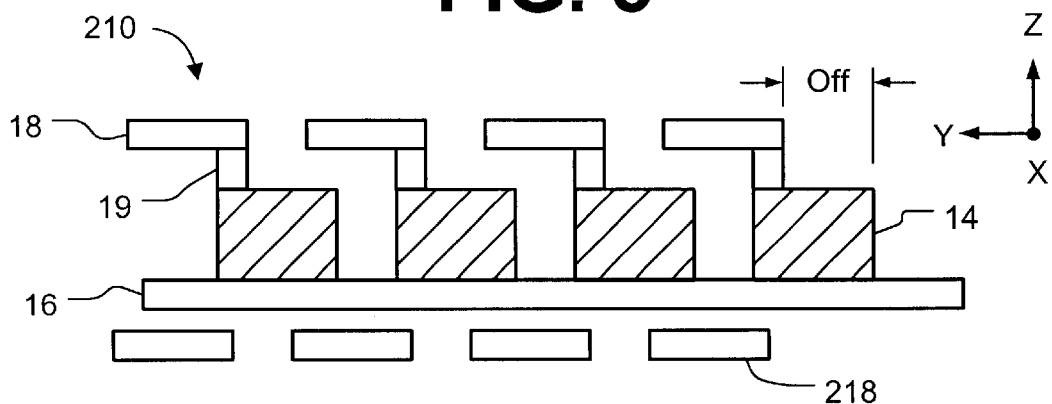
FIGS. 4 and 5 are illustrations of a second MRAM device according to the present invention.
Figure 4:
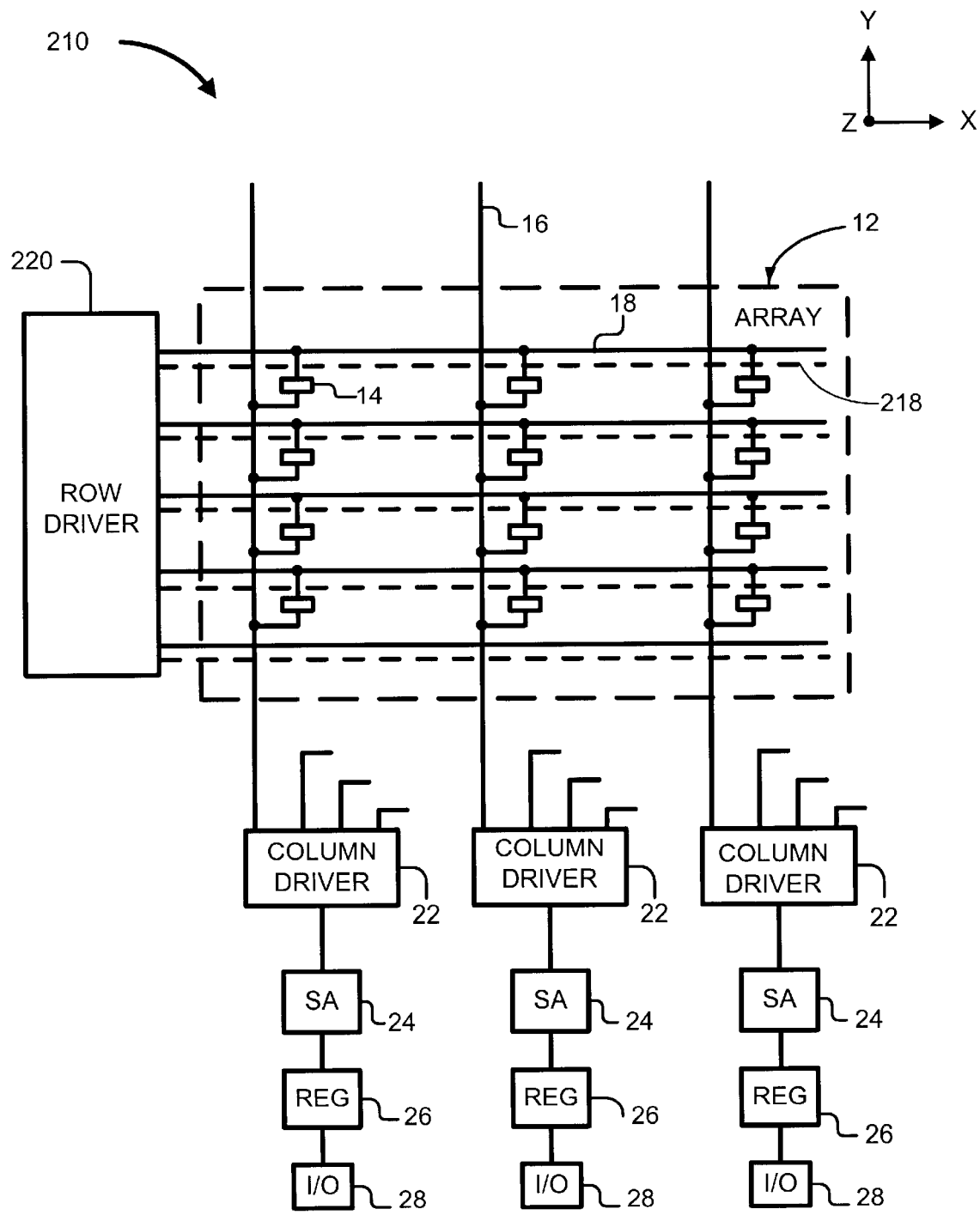

FIGS. 4 and 5 illustrate a second MRAM device 210 that is similar to the MRAM device 10 of FIGS. 1 and 2, except that the second MRAM device 210 further includes a level of second word lines 218 on the same side of the array 12 as the bit lines 16. The second word lines 218 extend along the x-direction. A row driver 220 supplies write currents to the first and second word lines 18 and 218 during write operations. The second word lines 218, indicated by dashed lines in FIG. 4, are beneath the bit lines 16. The second word lines 218 are electrically insulated from the bit lines 16 and the memory cells 14. However, when write currents are supplied to the two second word lines 218 nearest the selected memory cell 14, as well as a crossing bit line 16 and the two first word lines 18 nearest the selected memory cell 14, the selected memory cell sees magnetic fields from five lines. Thus, the second word lines 218 further increase the switching field.

Thus disclosed are MRAM devices 10 and 210 that provide significantly higher write fields than conventional devices having the same conductor spacing, size and current density. The higher write field capability allows the coercivity of the memory cells to be increased, whereby integrity of writing data to the memory cells is increased and the frequency of unselected bit erasures is reduced.

In the alternative, the write fields and current requirements for the word and bit lines can be reduced. Reducing the current requirements for a given field has the following direct benefits: it reduces heating, it allows the sense amplifiers and electronics to be made better and smaller, and it reduces electromigration problems in the conductor lines. For a given current constraint, the write fields that can be generated by the bit and word lines can be enhanced.

Figure 6:
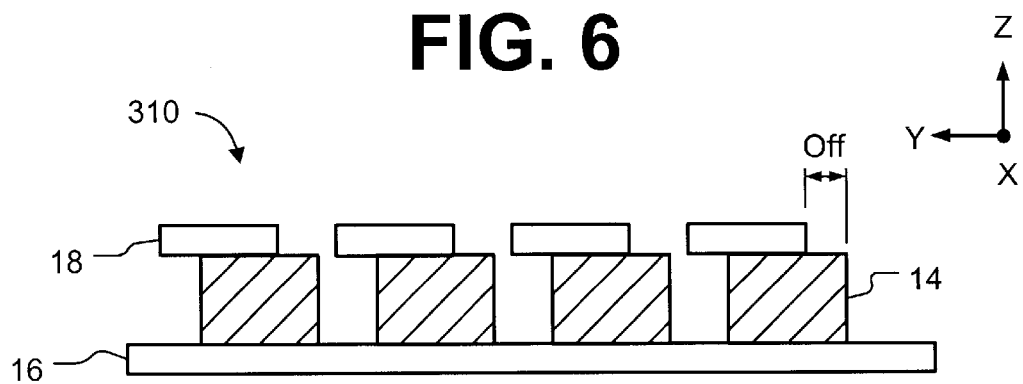
FIGS. 6–8 are illustrations of third, fourth and fifth MRAM device according to the present invention.

Although the MRAM devices 10 and 210 were described with a plurality of vias, the present invention is not so limited. Instead, both the word and bit lines may be in direct electrical contact with the magnetic memory cells. FIG. 6, for example, shows an MRAM device 310 in which the word lines 18 are offset with respect to the memory cells 14. The amount of the offset (Off) in the y-direction is such that each memory cell 14 is electrically connected to only one of the two nearest word lines 18. During a write operation, currents flowing through the bit line 16 and the two nearest word lines 18 are large enough to switch only the selected memory cell 14.

Figure 7:
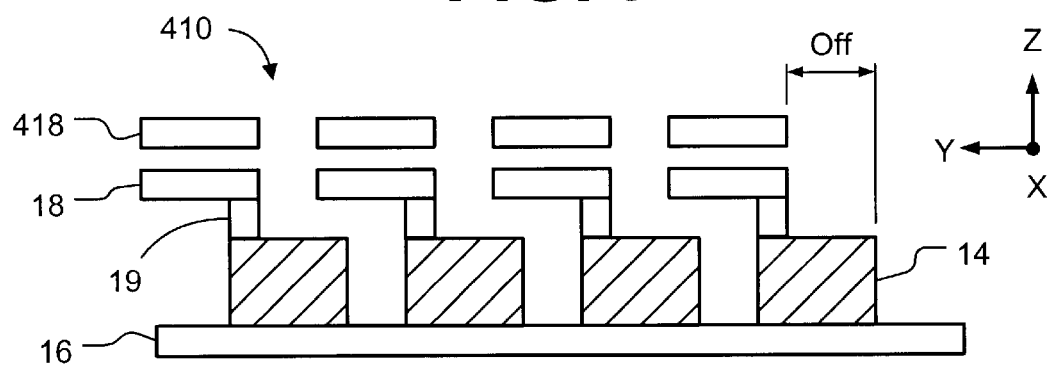
Figure 8:
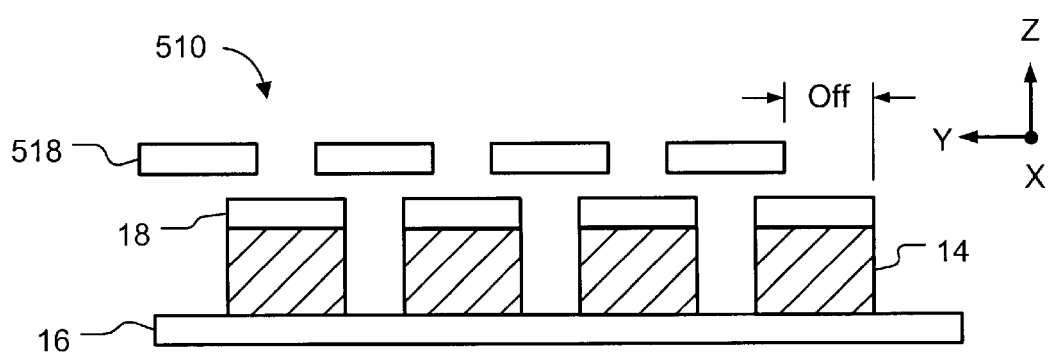

Additional levels of conductors may be fabricated. These additional levels may be spaced apart from the word and/or bit lines in a z-direction (the z-direction is orthogonal to the x- and y-directions). FIG. 7, for example, shows an MRAM device 410 in which an additional level of second word lines 418 is directly above and aligned with the first word lines 18. Thus the second word lines 418 are also offset (Off) in the y-direction from the memory cells 14. FIG. 8, for example, shows an MRAM device 510 in which the second conductors 518 are offset (Off) from the memory cells 14 in the y-direction. However, the first word lines 18 are not offset. Moreover, the first word lines 18 are in direct contact and aligned with the memory cells 14.

Although the MRAM devices have been described in connection with offset word lines, they are not so limited. The bit lines may be offset instead of the word lines, or, both word lines and bit lines may be offset. Additional levels of conductors may be added for the word lines only, for the bit lines only, or for the word lines and the bit lines.

The word and bit lines may be transposed. For example, an MRAM device may have the same configuration shown in FIG. 2, except that the bit lines are offset instead of the word lines.

The present invention is not limited to MRAM devices. It may be applied to other devices such as magnetic sensor arrays. Adjacent conductors can enhance the magnetic fields applied to magneto-resistive elements in the arrays.

Although specific embodiments of the present invention have been described and illustrated, the present invention is not limited to the specific forms or arrangements of parts so described and illustrated. Instead, the present invention is construed according to the claims that follow.

What is claimed is:

1. A data storage device comprising:

an array of magnetic memory cells; and a plurality of first conductors on one side of the memory cell array, the first conductors extending in a first direction;

the first conductors offset in a second direction from at least some of the memory cells, the first and second directions being orthogonal.

2. The device of claim 1, wherein at least some of the magnetic memory cells are between two adjacent first conductors.

3. The device of claim 1, wherein at least some of the magnetic memory cells are positioned to be exposed to magnetic fields from two adjacent first conductors when write currents are supplied to the two adjacent first conductors.

4. The device of claim 1, further comprising a plurality of second conductors on a second side of the memory cell array, the second conductors extending in the second direction and being in direct contact with the memory cells.

5. The device of claim 1, further comprising a plurality of second conductors on a second side of the memory cell array, the second conductors extending in the first direction and being spaced apart in a third direction from the memory cells, the third direction being orthogonal to the first and second directions.

6. The device of claim 1, further comprising a plurality of vias; wherein the first conductors are spaced apart in a third direction from the memory cells; and wherein each via electrically connects a first conductor to only one magnetic memory cell, the third direction being orthogonal to the first and second directions.

7. The device of claim 6, further comprising a level of second conductors electrically insulated from the first conductors, the first conductors located between the second conductors and the memory cells.

8. The device of claim 7, wherein the first conductors are offset in the second direction by the same amount as the second conductors.

9. The device of claim 1, further comprising a plurality of second conductors located between the first conductors and the memory cells; wherein each magnetic memory cell is in direct electrical contact with only one of the second conductors.

10. The device of claim 9, wherein the second conductors are aligned with the memory cells.

11. The device of claim 1, wherein each memory cell is in direct physical contact with only one of the first conductors.

12. The device of claim 1, further comprising a level of second conductors electrically insulated from the first conductors, the first conductors located between the second conductors and the memory cells.

13. The device of claim 1, wherein the memory cells include magneto-resistive devices.

14. A method of writing to a memory cell in the device of claim 1, the method comprising supplying write currents to the two adjacent first conductors that are closest to the memory cell.

15. A magnetic random access memory device comprising:
an array of magnetic memory cells;
a plurality of first conductors on a first side of the memory cell array, the first conductors extending in a first direction; and
a plurality of second conductors on a second side of the memory cell array, the second conductors extending in a second direction, the first and second directions being orthogonal;
the memory cells offset in a second direction from the first conductors.

16. The device of claim 1, further comprising a plurality of third conductors on the second side of the memory cell array, the third conductors extending in the first direction and being spaced apart from the memory cells in a third direction, the third direction being orthogonal to the first and second directions.

17. The device of claim 15, further comprising a plurality of vias; wherein the first conductors are spaced apart from the memory cells in a third direction; and wherein each via electrically connects a first conductor to only one magnetic memory cell, the third direction being orthogonal to the first and second directions.

18. The device of claim 17, further comprising a plurality of third conductors electrically insulated from the first conductors, the third conductors extending in the first direction, the first conductors located between the third conductors and the memory cells.

19. The device of claim 15, further comprising a plurality of third conductors located between the first conductors and the memory cells, the third conductors extending in the first direction; wherein each magnetic memory cell is in direct electrical contact with only one of the third conductors.

20. The device of claim 15, wherein each memory cell is in direct physical contact with one of the first conductors.

21. The device of claim 15, further comprising a level of third conductors electrically insulated from the first conductors, the first conductors located between the third conductors and the memory cells.

22. A method of writing to a memory cell in a magnetic random access memory device, the method comprising supplying write currents to two adjacent conductors that are closest to the memory cell.

23. Apparatus comprising:
an array of magneto-resistive elements; and
a plurality of first conductors on one side of the array, the first conductors extending in a first direction;
the first conductors offset in a second direction from at least some of the magnetic cells, the first and second directions being orthogonal.

* * * * *